United States Patent
Yeh et al.

(10) Patent No.: US 9,177,662 B1
(45) Date of Patent: Nov. 3, 2015

(54) PRE-READING METHOD AND PROGRAMMING METHOD FOR 3D NAND FLASH MEMORY

(71) Applicant: MACRONIX INTERNATIONAL CO., LTD., Hsinchu (TW)

(72) Inventors: Wen-Wei Yeh, Bade (TW); Chih-Shen Chang, New Taipei (TW); Kuo-Pin Chang, Miaoli County (TW)

(73) Assignee: MACRONIX INTERNAITONAL CO., LTD., Hsinchu (TW)

( * ) Notice: Subject to any disclaimer, the term of this patent is extended or adjusted under 35 U.S.C. 154(b) by 0 days.

(21) Appl. No.: 14/481,953

(22) Filed: Sep. 10, 2014

(51) Int. Cl.
*G11C 11/34* (2006.01)
*G11C 16/26* (2006.01)
*G11C 16/04* (2006.01)
*G11C 16/10* (2006.01)

(52) U.S. Cl.
CPC ............ *G11C 16/26* (2013.01); *G11C 16/0483* (2013.01); *G11C 16/10* (2013.01)

(58) Field of Classification Search
USPC .............. 365/185.03, 185.17, 185.18, 185.33
See application file for complete search history.

(56) References Cited

U.S. PATENT DOCUMENTS

| | | | |
|---|---|---|---|
| 8,854,879 B2* | 10/2014 | Shim et al. ............... | 365/185.33 |
| 8,917,548 B2* | 12/2014 | Edahiro et al. ........... | 365/185.18 |
| 9,047,983 B2* | 6/2015 | Scheuerlein et al. ................. | 1/1 |
| 9,053,978 B2* | 6/2015 | Nam .................................. | 1/1 |

* cited by examiner

*Primary Examiner* — Trong Phan
(74) *Attorney, Agent, or Firm* — McClure, Qualey & Rodack, LLP

(57) ABSTRACT

A pre-reading method and a programming method for a 3D NAND flash memory are provided. The pre-reading method comprises the following steps. A selected string includes a first memory cell, two second memory cells and a plurality of third memory cells. The two second memory cells are adjacent to the first memory cell. The third memory cells are not adjacent to the first memory cell. A first pass voltage is applied on the second memory cells, a second pass voltage is applied on the third memory cells, and a read voltage is applied on the first memory cell via a plurality of word lines for reading a data of the first memory cell. The first pass voltage is larger than the second pass voltage.

18 Claims, 5 Drawing Sheets

PRE-READING METHOD AND PROGRAMMING METHOD FOR 3D NAND FLASH MEMORY

TECHNICAL FIELD

This disclosure relates in general to a pre-reading method and a programming method, and more particularly to a pre-reading method and a programming method for a 3D NAND flash memory.

BACKGROUND

As critical dimensions of devices in integrated circuits shrink to the limits of common memory cell technologies, designers have been looking to techniques for stacking multiple planes of memory cells to achieve greater storage capacity, and to achieve lower costs per bit.

Therefore, a structure for three-dimensional integrated circuit memory with a low manufacturing cost, including reliable, very small memory elements is provided.

SUMMARY

The disclosure is directed to a pre-reading method and a programming method for a 3D NAND flash memory. Before programming the 3D NAND flash memory, a pre-reading method is performed, such that the 3D NAND flash memory can be correctly programmed.

According to one embodiment, a pre-reading method for a 3D NAND flash memory is provided. The pre-reading method comprises the following steps. A first select voltage is applied on one of a plurality of bit lines for selecting one of a plurality of layers. A second select voltage is applied on one of a plurality of string select lines for selecting one of a plurality of strings of the selected layer. The selected string includes a first memory cell, two second memory cells and a plurality of third memory cells. The two second memory cells are adjacent to the first memory cell. The third memory cells are not adjacent to the first memory cell. A first pass voltage is applied on the second memory cells, a second pass voltage is applied on the third memory cells, and a read voltage is applied on the first memory cell via a plurality of word lines for reading a data of the first memory cell. The first pass voltage is larger than the second pass voltage.

According to one embodiment, a programming method for a 3D NAND flash memory is provided. The programming method comprises the following steps. A first select voltage is applied on one of a plurality of bit lines for selecting one of a plurality of layers. A second select voltage is applied on one of a plurality of string select lines for selecting one of a plurality of strings of the selected layer. The selected string includes a first memory cell, two second memory cells and a plurality of third memory cells. The two second memory cells are adjacent to the first memory cell. The third memory cells are not adjacent to the first memory cell. A first pass voltage is applied on the second memory cells, a second pass voltage is applied on the third memory cells, and a read voltage is applied on the first memory cell via a plurality of word lines for reading a data of the first memory cell. The first pass voltage is larger than the second pass voltage. The first memory cell is programmed.

Figure 1:
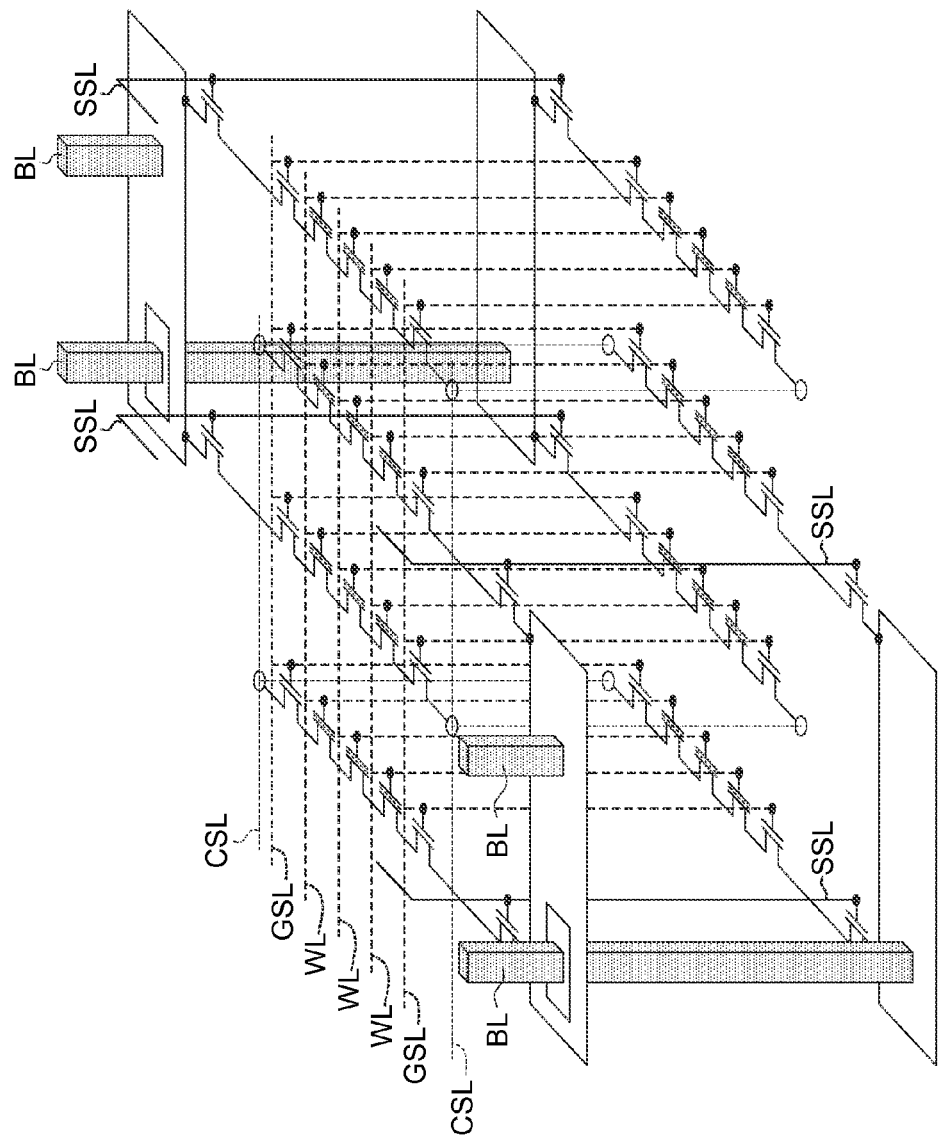
FIG. 1 shows a 3D NAND flash memory.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Please referring to FIG. 1, a 3D NAND flash memory 100 is shown. The 3D NAND flash memory 100 may be a BE-SONOS memory. The 3D NAND flash memory 100 includes a plurality of bit lines BL, a plurality of string select line SSL, a plurality of ground select line GSL, a plurality of common source line CSL and a plurality of word lines WL. Each bit lines BL is used for selecting a particular layer. Each string select line SSL is used for selecting a particular string.

In FIG. 1, one of the two layers can be selected by applying a first select voltage on one of the bit lines BL. In one layer, one of four strings can be selected by applying a second select voltage on one of the string select lines SSL. In one string, a plurality of memory cells can be turned on by applying a pass voltage and one memory cell can be read by applying a read voltage or can be wrote by applying a program voltage.

Figure 2:
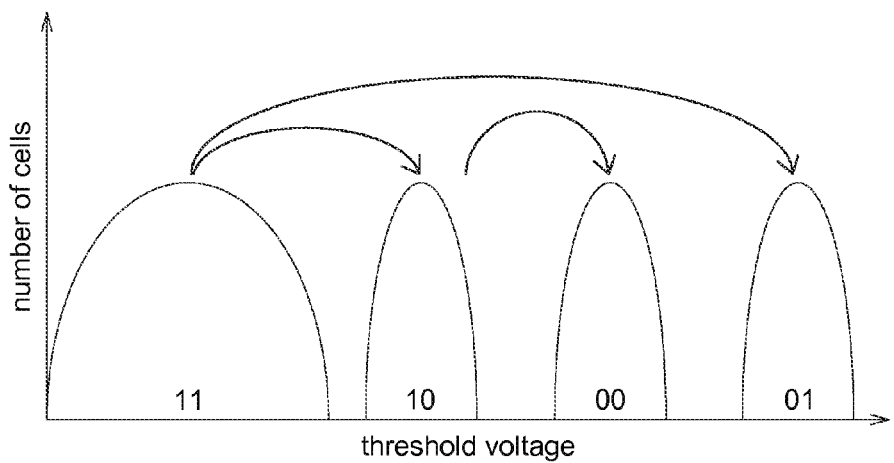
FIG. 2 shows four states of a multi-level cell (MLC) NAND flash memory.

Please referring to FIG. 2, four states of a multi-level cell (MLC) NAND flash memory are shown. In the MLC NAND flash memory, four states can be represented by a low page bit and a high page bit. For example, if the low page bit is "0" and the high page bit is "1", then the state is "10." If the low page bit is "1" and the high page bit is "0", then the state is "01." In a programing operation, if the MLC NAND flash memory is at the state "11", it can be programed to the state "10" by changing the low page bit from "1" to "0." If the MLC NAND flash memory is at the state "11", it can be programed to the state "01" by changing the high page bit from "1" to "0." If the MLC NAND flash memory is at the state "10", it can be programed to the state "00" by changing the high page bit from "1" to "0." That is to say, for programming the MLC NAND flash memory to be at a next state, it is needed to read the current state of the MLC NAND flash memory correctly.

Figure 3:
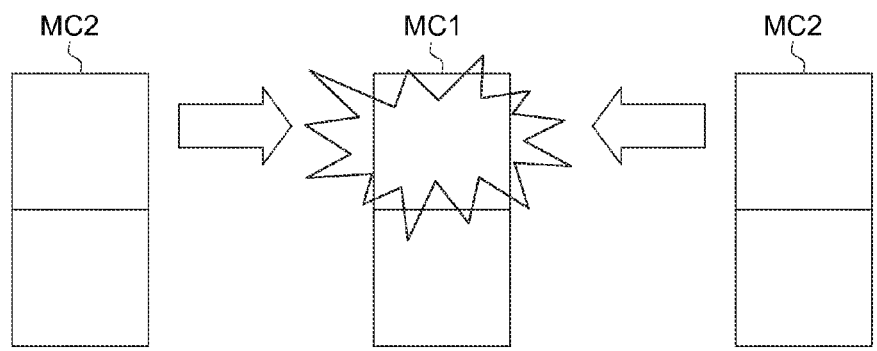
FIG. 3 shows an interference in the 3D NAND flash memory.

Please referring to FIG. 3, an interference in the 3D NAND flash memory 100 is shown. For reducing the size of the 3D NAND flash memory 100, gaps between a first memory cell MC1 and two second memory cells MC2 become narrow. The first memory cell MC1 disposed between the second memory cells MC2 may be interfered by the second memory cells MC2. The current state of the first memory cell MC1 may be read incorrectly. Then, the first memory cell MC1 cannot be programmed to be the next state correctly.

Figure 4:
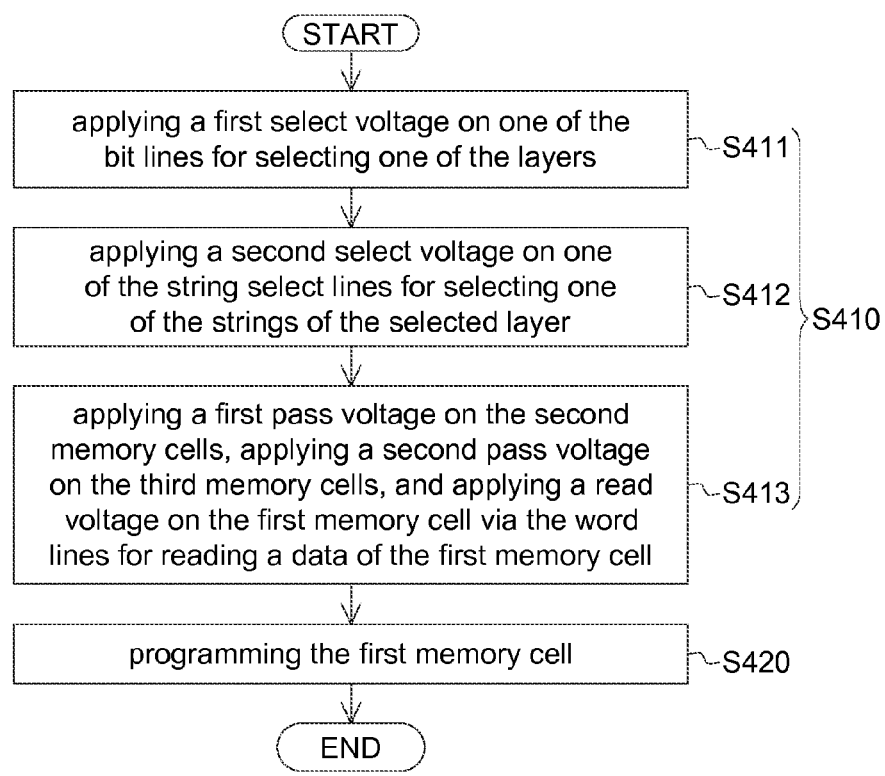
FIG. 4 shows a flowchart of a programming method of the 3D NAND flash memory.

Therefore, before programming the 3D NAND flash memory 100, a correct pre-read method is needed to be performed. Please referring to FIG. 4, FIG. 4 shows a flowchart of a programming method of the 3D NAND flash memory 100. Step S410 is a pre-reading method. Step S410 and step S420 are the programming method. The step S410 is performed before the step S420 for correctly reading the current state of each memory cell to be programmed in the 3D NAND flash memory 100.

The step S410 includes steps S411, S412 and S413. In step S411, referring to FIG. 1, a first select voltage is applied on one of the bit lines BL for selecting one of the layers. For example, the first select voltage may be 3V.

In step S412, referring to FIG. 1, a second select voltage is applied on one of the string select lines SSL for selecting one of the strings of the selected layer. For example, the second select voltage may be 3 V.

Figure 5:
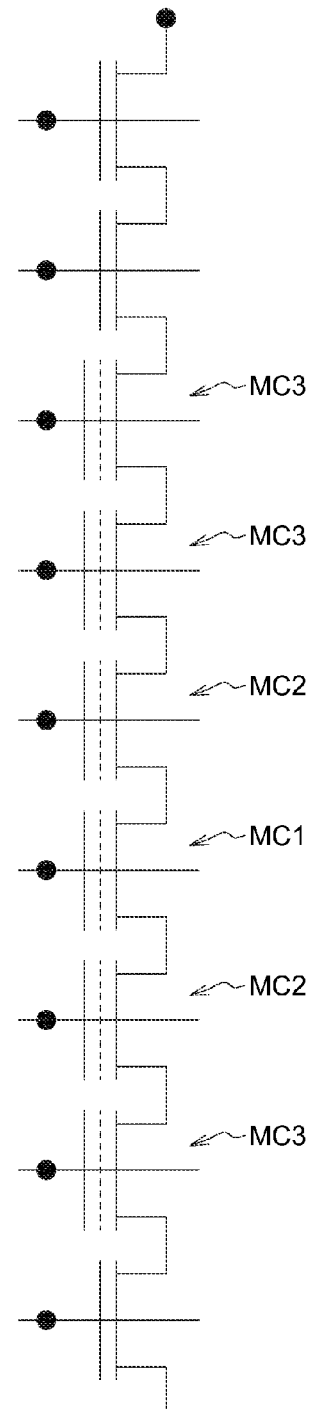
FIG. 5 shows a selected string.

Please referring to FIG. 5, FIG. 5 shows the selected string. The selected string includes the first memory cell MC1, the second memory cells MC2 and a plurality of third memory cells MC3. The second memory cells MC2 are adjacent to the first memory cell MC1, and the third memory cells MC3 are not adjacent to the first memory cell MC1. The first memory cell MC1 may be interfered by the second memory cells MC2.

In step S413, a first pass voltage is applied on the second memory cells MC2, a second pass voltage is applied on the third memory cells MC3, and a read voltage is applied on the first memory cell MC1 via the word lines WL for reading a data of the first memory cell MC1. The first pass voltage is larger than the second pass voltage.

Figure 6:
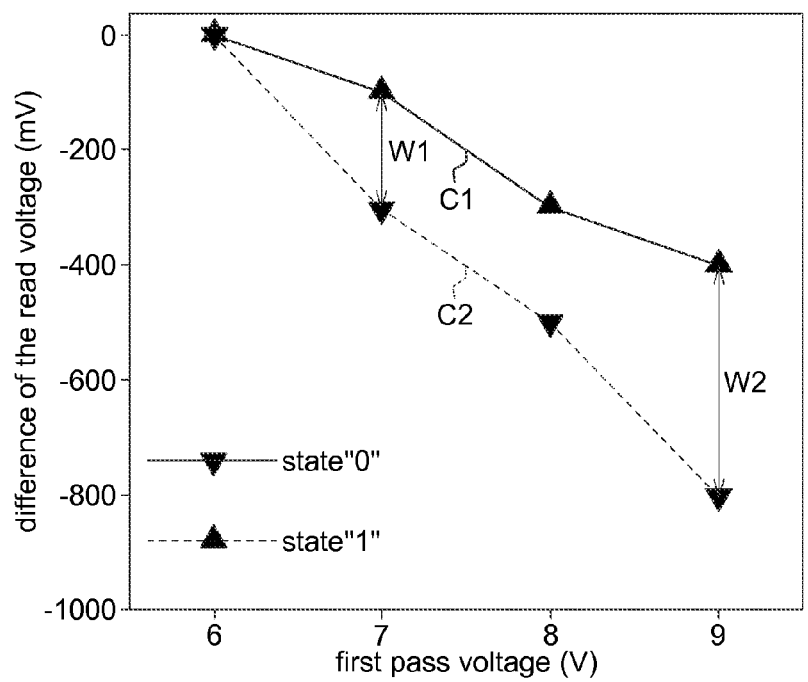
FIG. 6 shows two read voltage curves of a first memory cell suffered an interference.

Please referring to FIG. 6, two read voltage curves C1, C2 of the first memory cell MC1 suffered an interference are shown. In the read voltage curve C1, the first memory cell MC1 is at state "0" and in the read voltage curve C2, the first memory cell MC1 is at state "1." The second pass voltage applied on the third memory cells MC3 is 6V. As shown in FIG. 6, when the first pass voltage applied on the second memory cells MC2 is changed from 6V to 7V, the read voltage curve C1 is decreased 133 mV and the read voltage curve C2 is decreased 266 mV. The decrement of the read voltage curve C1 and the decrement of the read voltage curve C2 are different.

That is to say, there is a window W1 between the read voltage curve C1 and the read voltage curve C2 when the first pass voltage is larger than the second pass voltage. This window W1 can be used for identifying whether the first memory cell MC1 is at state "0" or at state "1."

Further, when the first pass voltage applied on the second memory cells MC2 is changed from 6V to 9V, the read voltage curve C1 is decreased 355 mV and the read voltage curve C2 is decreased 755 mV. That is to say, a window W2 between the read voltage curve C1 and the read voltage curve C2 become larger when the first pass voltage is much larger than the second pass voltage. Therefore, whether the first memory cell MC1 is at the state "0" or at the state "1" can be easily identified.

According to FIG. 6, if the first pass voltage is 7 to 9V which is larger than the second pass voltage, the current state of the first memory cell MC1 can be correctly read, even if the first memory cell MC1 is suffered the interference.

In one embodiment, the step S410 can be performed twice for reading the low page bit and the high page bit of the first memory cell MC1.

Next, in step S420, the first memory cell MC1 is programmed. Because the pre-read method, i.e. the step S410, is performed first, the first memory cell MC1 can be correctly programmed.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A pre-reading method for a 3D NAND flash memory, comprising:
    applying a first select voltage on one of a plurality of bit lines for selecting one of a plurality of layers;
    applying a second select voltage on one of a plurality of string select lines for selecting one of a plurality of strings of the selected layer, wherein the selected string includes a first memory cell, two second memory cells and a plurality of third memory cells, the two second memory cells are adjacent to the first memory cell, and the third memory cells are not adjacent to the first memory cell; and
    applying a first pass voltage on the second memory cells, applying a second pass voltage on the third memory cells, and applying a read voltage on the first memory cell via a plurality of word lines for reading a data of the first memory cell, wherein the first pass voltage is larger than the second pass voltage.

2. The pre-reading method according to claim 1, wherein the first pass voltage is 7 to 9V.

3. The pre-reading method according to claim 1, wherein the first pass voltage is 9V.

4. The pre-reading method according to claim 1, wherein the first pass voltage is larger than the second pass voltage 3V.

5. The pre-reading method according to claim 1, wherein the first pass voltage is 9V and the second pass voltage is 6V.

6. The pre-reading method according to claim 1, wherein the first select voltage is 3 V.

7. The pre-reading method according to claim 1, wherein the second select voltage is 3V.

8. The pre-reading method according to claim 1, wherein the pre-reading method is performed before a step of programming the first memory cell.

9. The pre-reading method according to claim 1, wherein the 3D NAND flash memory is a BE-SONOS memory.

10. A programming method for a 3D NAND flash memory, comprising:
    applying a first select voltage on one of a plurality of bit lines for selecting one of a plurality of layers;
    applying a second select voltage on one of a plurality of string select lines for selecting one of a plurality of strings of the selected layer, wherein the selected string includes a first memory cell, two second memory cells and a plurality of third memory cells, the second memory cells are adjacent to the first memory cell, and the third memory cells are not adjacent to the first memory cell;
    applying a first pass voltage on the second memory cells, applying a second pass voltage on the third memory cells, and applying a read voltage on the first memory cell via a plurality of word lines for reading a data of the first memory cell, wherein the first pass voltage is larger than the second pass voltage; and
    programming the first memory cell.

11. The programming method according to claim 10, wherein the first pass voltage is 7 to 9V.

12. The programming method according to claim 10, wherein the first pass voltage is 9V.

13. The programming method according to claim 10, wherein the first pass voltage is larger than the second pass voltage 3V.

14. The programming method according to claim 10, wherein the first pass voltage is 9V and the second pass voltage is 6V.

15. The programming method according to claim 10, wherein the first select voltage is 3 V.

16. The programming method according to claim 10, wherein the second select voltage is 3V.

17. The programming method according to claim 10, wherein the step of applying the read voltage on the first memory cell for read the data of the first memory cell is performed before the step of programming the first memory cell.

18. The programming method according to claim 10, wherein the 3D NAND flash memory is a BE-SONOS memory.

* * * * *